United States Patent [19]
Rao

[11] Patent Number: 5,906,965
[45] Date of Patent: May 25, 1999

[54] THIN FILM SUPERCONDUCTOR-INSULATOR-SUPERCONDUCTOR MULTI-LAYER FILMS AND METHOD FOR OBTAINING THE SAME

[75] Inventor: Muralidhar R. Rao, Goleta, Calif.

[73] Assignee: Superconductor Technologies, Inc., Santa Barbara, Calif.

[21] Appl. No.: 08/731,961

[22] Filed: Oct. 23, 1996

Related U.S. Application Data

[63] Continuation-in-part of application No. 08/650,150, Jan. 19, 1996.

[51] Int. Cl.$^6$ ................................................. H01L 39/24
[52] U.S. Cl. .................. 505/470; 505/473; 505/474; 505/741; 505/742; 505/237; 505/238; 505/701; 505/500; 428/930
[58] Field of Search .................. 428/212, 332, 428/689, 697, 699, 701, 702, 930; 505/190, 192, 210, 230, 233, 237, 238, 329, 473, 474, 475, 476, 477, 482, 500, 701, 702, 741, 742, 470

[56] References Cited

U.S. PATENT DOCUMENTS

| 5,340,799 | 8/1994 | Tauber et al. | 505/237 |
| 5,593,950 | 1/1997 | Mukaida et al. | 505/234 |
| 5,663,081 | 9/1997 | Sung et al. | 505/330 |

OTHER PUBLICATIONS

Y. Tazoh et al., "Extremely smooth YBa$_2$Cu$_3$Oy thin films grown using the reactive coevaporation technique in radical oxygen at an ultra low growth rate", *Appl. Phys. Lett.* 62(4), pp. 408–410, Jan. 25, 1993.

S. C. Tidrow et al., "Oxygen diffusion through dielectrics: A critical parameter in high critical temperature superconductors multilayer technology", *J. Mater. Res.*, vol. 10, No. 7, pp. 1622–1634, Jul. 1995.

"Planar Transmission Line Resonators from YBA$_2$CU$_3$O$_{7-x}$ Thin Films and Epitaxial Sis Multilayers," W. Rauch, E. Gornik, A.A. Valenzuela, G. Solkner, F. Fox, H. Behner, G. Gieres, and P. Russer, IEEE Transactions on Applied Superconductivity, vol. 3, No. 1, Mar. 1993, pp. 1110–1113.

"In–Situ Low Pressure Oxygen Annealing of YBa$_2$CU$_3$O$_{7-\delta}$ Single– and Multilayer Systems," G. Ockenfub, R. Wordenweber, TA Scherer, R. Unger, and W. Jutzi, Physica C 243 (1995), pp. 24–28.

*Primary Examiner*—Marie Yamnitzky
*Attorney, Agent, or Firm*—Lyon & Lyon LLP

[57] ABSTRACT

A high temperature superconductor (HTS) tri-layer structure and a method for providing the same are described. Preferable two dimensional growth for all layers is provided resulting in smooth surfaces and highly crystalline layers. Full oxygenation of HTS under-layer(s) is provided despite having thick intervening dielectric mid-layer. HTS over- and under-layers are preferably structurally and electrically similar and have high crystallinity, the HTS layers have high $T_c$ (e.g. >90K) comparable to $T_c$ of single layer superconductor layers and a high $J_c$ (e.g. >10$^6$ A/cm$^2$), the tri-layer properties do not significantly degrade as the thickness of the layers is increased, and the dielectric mid-layer has high resistivity and is substantially pin-hole free. The HTS tri-layer structure of the present invention is achieved by using a capping-layer to protect the HTS under-layer, by conducting an oxygen anneal to fully oxygenate the HTS layers, and/or by thermally matching the substrate to the other layers (e.g. by using buffer layers to overcome lattice mismatch problems). The present invention also provides an improved HTS capacitor having low loss at microwave frequencies and having a smaller size and/or greater capacitance per area unit when compared to convention HTS capacitors.

21 Claims, 4 Drawing Sheets

THIN FILM SUPERCONDUCTOR-INSULATOR-SUPERCONDUCTOR MULTI-LAYER FILMS AND METHOD FOR OBTAINING THE SAME

RELATED APPLICATION

This application is a continuation-in-part to application Ser. No. 08/650,150 filed Jan. 19, 1996, the disclosure of which is hereby incorporated as if fully set forth herein.

FIELD OF INVENTION

The present invention relates to multi-layer structures and methods for making the same, particularly as they relate to thin film multi-layer structures comprising high temperature superconductor/insulator/high temperature superconductor tri-layers.

BACKGROUND

Superconductivity refers to that state of metals and alloys in which the electrical resistivity is zero when the specimen is cooled to a sufficiently low temperature. The temperature at which a specimen undergoes a transition from a state of normal electrical resistivity to a state of superconductivity is known as the critical temperature ("$T_c$").

In the past, attaining the $T_c$ of the then known superconducting materials required the use of liquid helium and expensive cooling equipment. However, more recently superconducting materials having higher critical temperatures have been discovered. Collectively these are referred to as high temperature superconductors (HTSs). Currently, HTSs having critical temperatures in excess of the boiling point of liquid nitrogen, 77K (i.e. about −196° C. or about −321° F.) at atmospheric pressure, have been disclosed.

Superconducting compounds consisting of combinations of alkaline earth metals and rare earth metals such as barium and yttrium in conjunction with copper (known as "YBCO superconductors") were found to exhibit superconductivity at temperatures above 77K. See, e.g., Wu, et al., Superconductivity at 93K in a New Mixed-Phase Y—Ba—Cu—O Compound System at Ambient Pressure, 58 Phys. Rev. Lett. 908 (1987). In addition, high temperature superconducting compounds containing bismuth have been disclosed. See, e.g., Maeda, A New High-Tc Oxide Superconductor Without a Rare Earth Element, 37 J. App. Phys. L209 (1988); and Chu, et al., Superconductivity up to 114K in the Bi—Al—Ca—Br—Cu—O Compound System Without Rare Earth Elements, 60 Phys. Rev. Lett. 941 (1988). Furthermore, superconducting compounds containing thallium have been discovered to have critical temperatures ranging from 90K to 123K (some of the highest critical temperatures to date). See, e.g., Koren, et al., 54 Appl. Phys. Lett. 1920 (1989).

These HTSs have been prepared in a number of forms. The earliest forms were preparation of bulk materials, which were sufficient to determine the existence of the superconducting state and phases. More recently, HTS thin films on various substrates have been prepared which have proved to be useful for making practical superconducting devices.

Difficulty is typically encountered when trying to provide such films in three dimensional structures. For example, a tri-layer structure incorporating two layers of HTS thin film separated by an insulator or dielectric would be highly desirable. Some attempts at tri-layer structures (i.e. HTS under-layer/insulator mid-layer/HTS over-layer) have been previously described. See, e.g., W. Rauch, et al., "Planar Transmission Line Resonators From $YBa_2Cu_3O_{7-x}$ Thin Films And Epitaxial SIS Multilayers," 3 IEEE Trans. Appl. Supercon. 1110 (1993); S. Z. Wang, et al., "$YBa_2Cu_3O_7$/$NdGaO_3$/$YBa_2Cu_3O_7$ Tri-layers By Modified Off-Axis Sputtering," 73 J. Appl. Phys. 7543 (1993); J. S. Horwitz, et al., "Origins of Conductive Losses At Microwave Frequencies In $YBa_2Cu_3O_7$/$NdGaO_3$/$YBa_2Cu_3O_7$ Trilayers Deposited By Pulsed Laser Deposition," 7 J. Supercon. 965 (1994); A. E. Lee, et al., "Epitaxially Grown Sputtered $LaAlO_3$ Films," 57 Appl. Phys. Lett. 2019 (1990); G. Brorsson, et al., "Laser-Deposited $PrGaO_3$ Films On $SrTiO_3$ Substrates And In $YBa_2Cu_3O_7$/$PrGaO_3$/$YBa_2Cu_3O_7$ Trilayers," 61 Appl. Phys. Lett. 486 (1992); S. Tanaka, et al., "Epitaxial Growth of YBCO/MgO/YBCO Structure," Advances in Superconductivity III (Kajimura & Hayakawa Eds. 1991); M. Matsui, et al., "Hetero-epitaxial Growth of MgO/YBCO Thin Films by Excimer Laser Deposition," Advances in Superconductivity III, (Kajimura & Hayakawa Eds. 1991); and J. J. Kingston, et al., "Multilayer $YBa_2Cu_3O_7$—$SrTiO_3$—$YBa_2Cu_3O_7$ Films for Insulating Crossovers," 56 Appl. Phys. Lett. 189 (1990). However, problems were found with each of these suggested structures. Such as, for example, the HTS layers were not sufficiently crystalline, the transition temperature ($T_c$) and/or the critical current density ($J_c$) for the HTS layers were not comparable to that for each HTS as a single layer thin film, the properties of the HTS and insulator layers degraded as the thicknesses of the layers increased, the resistivity of the dielectric layer was too high, and/or the dielectric was not pinhole-free.

Specifically, for example, in Rauch, et al., the HTS over-layer grew with increasing polycrystalline portions which resulted in degraded $T_c$ and $J_c$ properties of the over-layer; in Wang, et al., the insulating dielectric mid-layer had pinholes which resulted in microshorts between the HTS layers; in Horwitz, et al., the total tri-layer thickness was merely 0.75 μm (i.e. was insufficient to provide microwave capacitive elements or other similar structures); in Lee, et al., the HTS under-layer had a low $T_c$ (between 82–87K), in Brorsson, et al., the insulating dielectric mid-layer had pinholes and the HTS over-layer was polycrystalline; in Tanaka, et al., no electrical data for HTS layers was reported; in Matsui, et al., no electrical data for HTS layers was reported and the HTS/insulator interfaces were disrupted; and in Kingston, et al., the total tri-layer thickness was merely 1 μm (i.e. was insufficient to provide microwave capacitive elements or other similar structures).

Some of these problems may be due to the HTS growth mode (i.e. two or three dimensional), due to an oxygen deficiency in an HTS layer, and/or due to differences in thermal expansion coefficients of the substrate and the tri-layer materials.

It should be noted that the present specification uses the terms "two-dimensional growth mode" and "three-dimensional growth mode" in a qualitative manner, and, as so used, these terms may be used in a different sense by other workers. With respect to the present specification, growth of a material as a thin film can occur in a two-dimensional mode or in a three-dimensional mode depending on the growth conditions. In two-dimensional modes growth of the film takes place in a layered manner, resulting in smooth surfaces and high crystal quality. In three-dimensional modes growth takes place unevenly and results in defective and undesirably rough surfaces. In addition, the roughness and defectiveness of layers grown in three-dimensional modes increases with increasing thickness thereby limiting the ability to grow quality layers of sufficient practical thickness.

For example, using a pulsed laser deposition (PLD) process NdAlO$_3$ grows in a two-dimensional mode when the substrate temperature ("T$_B$") is 800° C. and the oxygen pressure ("P(O$_2$)") is 20 mTorr; and in a three-dimensional mode when the T$_B$ is 800° C. and P(O$_2$) is 500 mTorr. If NdAlO$_3$ were used as the insulator mid-layer in a tri-layer structure, the NdAlO$_3$ mid-layer would be grown over an HTS under-layer and an HTS over-layer would be grown over the NdAlO$_3$ mid-layer. However, the oxygen pressure used to allow two-dimensional growth of NdAlO$_3$ is insufficient to maintain thermodynamic stability of an HTS such as YBCO. The growth of a NdAlO$_3$ mid-layer on a YBCO under-layer under two-dimensional growth conditions would result in a progressive loss of oxygen from the YBCO under-layer crystal structure to a point at which the YBCO would decompose into various oxides.

Continuing with the same example, growing the NdAlO$_3$ mid-layer under three-dimensional growth conditions is unacceptable because the resulting NdAlO$_3$ mid-layer has a rough surface. An insulator mid-layer with a rough surface will adversely affect the ability to grow an acceptable HTS over-layer. For example, growing a YBCO layer on a rough surface insulator layer, causes the YBCO to grow in a three-dimensional mode due to the rough template provided by the rough surface. In addition, a YBCO layer grown on a rough surface tends to be polycrystalline and tends to have degraded crystalline properties.

Therefore, a method is needed in which an insulator mid-layer can be grown in a two-dimensional mode on an HTS under-layer without substantially permanently adversely affecting the HTS under-layer.

As is mentioned above, some of the problems of prior tri-layer structures may be due to an oxygen deficiency in an HTS layer, particularly in the HTS under-layer. Typically, in single layer YBCO films, oxygen is introduced after growth of the film by cooling the film in an oxygen atmosphere where P(O$_2$) is 760 Torr. The additional oxygen increases the T$_c$ of the film. Because oxygen diffuses rapidly into YBCO, a fully oxygenated YBCO film may be obtained even upon rapid cool down where the oxygen pressure is raised to about 760 Torr near the growth temperature. However, in a tri-layer structure an HTS over-layer and an insulator/dielectric mid-layer act as barriers to oxygen diffusion into an HTS under-layer. The typical cool-down conditions for single layer films are insufficient when used for tri-layers as the YBCO under-layer is oxygen deficient and non-superconducting after such processing.

Elaborate and expensive processes have been used to oxygenate YBCO layers when standard heat treatments were unsuccessful due, for example, to the YBCO layer being an under-layer and the structure being thick. For example, Ockenfuβ, et al., used a radio frequency oxygen plasma to oxygenate NdGaO$_3$/YBCO bilayers when they were unable to oxygenate the bilayers by standard heat treatments. See, G. Ockenfuβ, et al., "In-Situ Low Pressure Oxygen Annealing of YBa$_2$Cu$_3$O$_{7-\delta}$ Single- and Multilayer Systems," 243 Physica C 24 (1995). In another example, Chew, et al., used a microwave oxygen plasma to oxygenate structures which were more than 1 μm thick when they were unable to oxygenate the structures by standard heat treatments. N. G. Chew, et al., "Importance of Process Control for Superconductor Thin Film Growth," S3-1 ISTEC Workshop on Superconductivity 97 (1995). Therefore, a technique is needed to provide a fully oxygenated YBCO under-layer in a tri-layer structure without requiring to elaborate or expensive plasma treatments.

As is mentioned above, some of the problems of prior tri-layer structures may be due to differences in thermal expansion coefficients of the substrate and the various tri-layer materials. Such differences in thermal expansion coefficients can typically result in cracking in the layers, particularly as the thicknesses of the layers is increased. Therefore, a method is needed in which thick layers are used in a tri-layer structure and cracking of the layers is prevented.

Also, conventional HTS capacitors for microwave applications are typically made using HTS layers grown on both sides of a planar substrate (which serves as the dielectric). Such substrates have thicknesses on the order of several hundreds of microns. However, if the thickness of the dielectric could be made smaller, then the size of a capacitor for a given capacitance would correspondingly decrease, and/or the capacitance for a given size of capacitor would correspondingly increase. A method is needed to form HTS capacitors with smaller dielectrics so resulting capacitors could be smaller and/or stronger.

Prior to now there has been no completely satisfactory way to adequately prepare a tri-layer structure in which an insulator/dielectric mid-layer can be grown in a two-dimensional mode on an HTS under-layer without adversely affecting the HTS under-layer in a way which is somewhat easily reversible. In addition, prior to now there has been no way to provide a fully oxygenated HTS under-layer (e.g. YBCO) in a tri-layer structure in a somewhat easy and inexpensive manner (i.e. using standard heat treatments, e.g., without requiring use of elaborate or expensive plasma treatments). Furthermore, prior to now there has been no way to prepare a tri-layer structure in which thick layers are used and cracking of the layers is avoided. Also, prior to now there has been no way to provide smaller HTS capacitors with increased capacitances.

SUMMARY OF THE INVENTION

The present invention presents methods of preparing an improved tri-layer structure in which: (1) an insulator mid-layer is grown in a two-dimensional mode on an HTS under-layer without substantially permanently adversely affecting the HTS under-layer; (2) a fully oxygenated HTS under-layer (e.g. YBCO) is provided using standard heat treatments; and (3) thick layers are used while avoiding cracking of the layers. This invention also relates to structures formed by such methods. Such structures, for example, may be used to provide HTS capacitors having sizes smaller and capacitances larger per area unit than current HTS capacitors.

More particularly, the present invention provides tri-layer structures in which the superconductor layers are preferably structurally and electrically similar and have high crystallinity, the superconductor layers have T$_c$ comparable to T$_c$ of single layer superconductor layers and a high J$_c$, the tri-layer properties do not significantly degrade as the thickness of the layers is increased, and the dielectric mid-layer has high resistivity and is substantially free of pin-holes. In addition, the tri-layer structure of the present invention may be used to provide a HTS capacitor in which a dielectric mid-layer having a thickness on the order of microns is used as the capacitor dielectric (as compared to using a substrate having a thickness on the order of hundreds of microns as the capacitor dielectric as in current HTS capacitors).

Specifically, the present invention presents a method for growing a dielectric (e.g. NdAlO$_3$) mid-layer under two-dimensional growth conditions while preventing significant decomposition of a HTS under-layer (e.g. YBCO). This is accomplished by growing a thin capping-layer on the HTS under-layer wherein the capping-layer is a slow diffuser of oxygen. For example, a $SrTiO_3$ capping-layer, due to the slow rate of diffusion of oxygen through $SrTiO_3$ under processing conditions, prevents excessive oxygen loss from a YBCO under-layer during growth of a two-dimensional $NdAlO_3$ mid-layer. In the time it takes to grow the $NdAlO_3$ mid-layer, the $SrTiO_3$ capping-layer sufficiently prevents the oxygen content of the YBCO under-layer from dropping to the point of significant decomposition of the YBCO.

The present invention thereby enables growth of a highly crystalline HTS over-layer due to having a smooth (two-dimensionally grown) mid-layer surface on which to grow the HTS over-layer. Because it enables two-dimensional mode growth, the present invention enables growth of thick layers without compromising layer quality (i.e. by removing the constraints on layer thickness presented by three-dimensional mode growth).

In addition, the present invention presents a method for providing a fully oxygenated HTS under-layer (e.g. YBCO) in a tri-layer structure. Specifically, this is accomplished by modifying the typical cool-down schedule to perform, essentially, an oxygen annealing step. Particularly, the tri-layer is initially cooled to a predetermined temperature (e.g. 550° C.) in an oxygen atmosphere (e.g. $P(O_2)$=760 Torr), is held at that elevated temperature for an extended period of time (e.g. 60 hours), and then is allowed to cool to room temperature. The present invention thereby demonstrates that when dealing with high quality layers and carefully selected oxygen anneal temperature, pressure, and time, oxygenation of a HTS under-layer (e.g. YBCO) in a tri-layer structure can be achieved using standard heat treatment techniques. The present invention also demonstrates that oxygenation of a HTS under-layer in a thick tri-layer structure can be accomplished without requiring the use of a plasma treatment.

Furthermore, the present invention presents a method for providing thick layers without the layers cracking. This is accomplished by using thermally matched materials in the tri-layer. Preferably, the substrate is, for example, MgO when using YBCO as the HTS. MgO is preferable for use with YBCO because it has a thermal expansion coefficient which is closer to YBCO than is the thermal expansion coefficient for $LaAlO_3$. However, it is known that MgO has poorer lattice mismatch to YBCO than does $LaAlO_3$.

To compensate for the lattice mismatch problem, a buffer layer of $SrTiO_3$ is preferably used between the YBCO under-layer and the MgO substrate. See, e.g., J. Cheung, et al., "Reproducible Growth of High Quality $YBa_2Cu_3O_{7-x}$ Thin Films on (100) MgO With a $SrTiO_3$ Buffer Layer by Pulsed Laser Deposition," 60 Appl. Phys. Lett. 3180 (1992). Use of an intermediate buffer layer leads to an improved quality of the layers. Use of MgO as the substrate layer with YBCO as the HTS allows growth of tri-layer structures without cracks where use of (100)-$LaAlO_3$ as the substrate with YBCO as the HTS leads to cracks. Use of layers with similar thermal expansion coefficients allows growth of tri-layer structures at thicknesses which crack when the thermal expansion coefficients of the layers are not as well matched.

The present invention also provides a way of forming a tri-layer capacitor with low-loss at microwave frequencies when operated at temperatures below $T_c$. The low loss at microwave frequencies of the insulator mid-layer (e.g. loss tangent of the dielectric below $10^{-3}$) and the low surface resistances of the HTS over- and under-layers at $T_c$ (e.g. surface resistances orders of magnitude lower than ordinary metal such as, for example, copper) result in a low loss capacitor suitable for microwave applications.

As is described above, conventional capacitors for microwave applications are made using HTS layers grown on both sides of a planar substrate (which serves as the dielectric), and have thicknesses on the order of several hundreds of microns. However, the thickness of the dielectric in a tri-layer of the present invention, is on the order of a micron. Therefore, capacitors formed from the tri-layer structure of the present invention can be hundreds of times smaller than conventional capacitors for the same capacitance. For the same area, the values of tri-layer capacitors can be hundreds of times larger than conventional capacitors. Therefore, the tri-layer structure of the present invention realizes low loss microwave capacitors of extremely small area, or with extremely high capacitances when compared to conventional HTS capacitors.

It is an object of the present invention to provide a tri-layer structure in which the high temperature superconductor layers are preferably structurally and electrically similar, have high crystallinity, have critical temperature (i.e. $T_c$) similar to that for single layer superconductors, and have high critical current density (i.e. $J_c$); and to provide a method of providing such a structure.

It is an additional object of the present invention to provide a tri-layer structure in which the tri-layer properties do not significantly degrade as thickness of the layers is increased; and to provide a method of providing such a structure.

It is a further object of the present invention to provide a tri-layer structure in which the dielectric layer has high resistivity and is substantially pinholefree; and to provide a method of providing such a structure.

It is another object of the present invention to provide tri-layer structure in which the dielectric mid-layer is grown under two-dimensional growth conditions while significant decomposition of a HTS under-layer is avoided; and to provide a method of providing such a structure.

It is also an object of the present invention to provide a fully oxygenated HTS under-layer in a tri-layer structure; and to provide a method of providing such a structure.

It is a further object of the present invention to provide a HTS capacitor having a dielectric multiple times smaller than conventional HTS capacitors; and a method of providing the same. Other objects and features of the present invention will become apparent from consideration of the following description taken in conjunction with the accompanying drawings.

DETAILED DESCRIPTION OF THE PREFERRED EMBODIMENT

Achieving good quality usable high temperature superconductor/insulator/high temperature superconductor tri-layer structures is accomplished by the present invention by providing for some or all of the following: by growing layers whose surfaces are two dimensional, by providing sufficient oxygenation of the high temperature superconductor (HTS) layers (both under- and over-layers), and by better matching thermal expansion coefficients of each layer of the tri-layer. The present invention comprises a HTS tri-layer structure and a method of providing the same.

Figure 1:
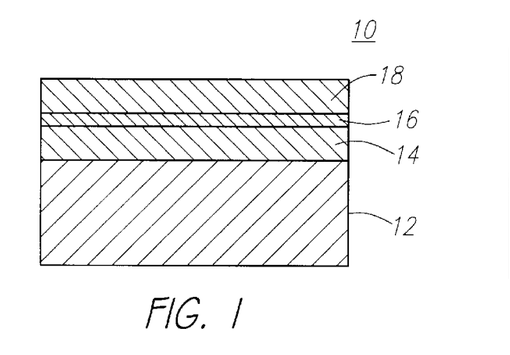
FIG. 1 is a exemplary schematic of a tri-layer structure in general.

An exemplary schematic of a tri-layer structure 10 is shown in FIG. 1. As is shown in FIG. 1, a tri-layer structure 10 comprises a substrate 12 upon which a HTS under-layer 14 is provided, an insulator mid-layer 16 is layered on the under-layer 14, and a HTS over-layer 18 is layered on the mid-layer 16 (each of the HTS layers may comprise the same or differing HTS material).

A first aspect of the preferred embodiment of the present invention comprises a HTS tri-layer structure in which the layers are grown two-dimensionally and a method for providing the same. Two-dimensional growth of various HTSs on various substrates is well known. The device(s) and method(s) of the present invention could incorporate various substrates (e.g. SrTiO$_3$, NdAlO$_3$, or any other substrate reported in the literature for HTS growth) and various HTS materials (e.g. YBCO, TBCCO, films containing HgBaCuO, BiSrCaCuO, TlBaCaCuO, perovskites ABO$_3$, where A and B include La, Sr, Al, Ta, Ti, etc. . . . , (i.e. LaAlO$_3$, SrTiO$_3$, BaTiO$_3$, CaZrO$_3$, and BaZrO$_3$) or other compounds such as MgAl$_2$O$_4$, SrAlTaO$_6$, and SrAlNbO$_6$, etc.).

In the preferred embodiment the insulator mid-layer is NdAlO$_3$. The NdAlO$_3$ mid-layer is grown under two-dimensional growth conditions while the significant decomposition of the underlying HTS under-layer is prevented by providing a thin capping-layer of a slow oxygen diffuser on the HTS under-layer. For example, when the HTS under-layer is YBCO, a capping-layer of SrTiO$_3$ may be grown thereon. SrTiO$_3$ is known to be a slow diffuser of oxygen, particularly when compared with NdAlO$_3$. Using a slow diffuser of oxygen as the material for the capping-layer prevents excessive oxygen loss from the underlying HTS under-layer during growth of an insulator mid-layer. For example, use of a SrTiO$_3$ capping-layer on a YBCO under-layer prevents the YBCO under-layer from losing oxygen during two dimensional growth of a, for example, NdAlO$_3$ mid-layer. In other words, in the time it takes to grow a sufficiently thick quality mid-layer, the oxygen content of the YBCO under-layer does not drop to a level below which substantial decomposition of the YBCO would take place.

Those of skill in the art recognize that any material which is a slow diffuser of oxygen (when compared to the HTS in question), for example, SrTiO$_3$, MgO, LaLiTi$_2$O$_6$, and LaNaTi$_2$O$_6$, would work, with varying efficiency, as a capping-layer in the present invention. Considerations in selecting the material to use for the capping-layer include the material's rate of diffusion of oxygen and required deposition parameters (e.g. pressure and temperature). As is also recognized by those skilled in the art, the rate of diffusion of oxygen from (or through) a material may be measured and denoted by a diffusion constant of oxygen, $D_O$, and an activation energy for oxygen diffusion, $E_d$. Knowing $D_O$ and $E_d$ for a material enables calculation (extrapolation) of the $D_O$ at various temperatures. For example, known and extrapolated values for $D_O$ are shown in Table I.

TABLE I

| Material | MgO | SrTiO$_3$ | CeO$_2$ |
|---|---|---|---|
| Temperature range (K.) | 1300–1700 | 1100–1500 | 1100–1400 |
| $D_0$ (cm$^2$/s) (known) in temperature range | $10^{-9}$–$10^{-11}$ | $10^{-11}$ | $10^{-5}$ |
| Reported $E_d$ (kJ/mole) | 250 | 65 | 75 |
| $D_0$ (cm$^2$/s) at 360° C. (extrapolated) | $10^{-29}$–$10^{-31}$ | $10^{-17}$ | $10^{-11}$ |
| $D_0$ (cm$^2$/s) at 660° C. (extrapolated) | $10^{-23}$–$10^{-25}$ | $10^{-15}$ | $10^{-9}$ |
| Oxygen diffuser type | Slow | Slow | Fast |

In addition, since the $D_O$ for YBCO is well known at temperatures of 360° C. ($D_O \approx 2 \times 10^{-12}$ cm$^2$/s) and 660° C. ($D_O \approx 5 \times 10^{-10}$ cm$^2$/s), it can be compared to the diffusion constants of other materials at the same temperatures. For example, the $D_O$ for CeO$_2$ between the temperatures of 360° C. and 660° C. is orders of magnitude larger than in YBCO over this same temperature range. Therefore, CeO$_2$ can be classified as a fast diffuser of oxygen for the purposes of the present invention. The $D_O$'s for MgO and SrTiO$_3$ are orders of magnitude smaller than the $D_O$ for YBCO between 360° C. and 660° C. Therefore, MgO and SrTiO$_3$ can be classified as slow diffusers of oxygen for the purposes of the present invention. Therefore, slow and fast diffusers of oxygen may be quantified as follows: Using "$D_O$(HTS)" and "$D_O$ (oxide)" to designate the diffusion constants at a temperature T of an HTS and a oxide (cap) respectively, and the ratio $D_O(HTS)/D_O(\text{oxide})=R$ The present inventors have found that the value of R for a slow diffuser of oxygen is preferably between about 10 to $10^{25}$, more preferably between about $10^3$ to $10^{20}$, and most preferably between about $10^4$ to $10^{18}$.

The capping-layer growth conditions and thickness determine the effectiveness of the capping-layer in protecting the underlying HTS under-layer. More specifically, it has been discovered that SrTiO$_3$ capping-layer can be grown at $T_B=815°$ C. and P(O$_2$)=200 mTorr, and that a YBCO under-layer is stable at these conditions. Under such conditions SrTiO$_3$ grows in a two-dimensional mode, and provides a smooth surface for growth of an insulator mid-layer. It has also been discovered that for a SrTiO$_3$ capping-layer over a YBCO under-layer, the capping-layer thickness necessary is dependent on the substrate upon which the YBCO under-layer is grown. For a YBCO under-layer on a MgO substrate it has been found that a SrTiO$_3$ thickness of 120 nm is sufficient, whereas on a LaAlO$_3$ substrate the SrTiO$_3$ thickness of 60 nm is sufficient.

In addition, SrTiO$_3$ could be used as a dielectric layer. See, e.g., J. J. Kingston, et al., "Multilayer YBa$_2$Cu$_3$O$_7$—

SrTiO$_3$—YBa$_2$Cu$_3$O$_7$ Films for Insulating Crossovers," 56 Appl. Phys. Lett. 189 (1990). SrTiO$_3$ has a high relative dielectric constant (i.e. about 300) and high loss at microwave frequencies, making it unsuitable for microwave applications. However, if applications are disregarded, from a purely structural and process point of view, the growth conditions used for SrTiO$_3$ in the present work would allow its growth up to a thickness of about 0.5 μm for use as a dielectric layer in the tri-layer, as thicker layers would have a rough surface leading to a degraded HTS over-layer. Therefore, it is preferred that SrTiO$_3$ be used as a capping-layer or as a layer of a dual layer dielectric (i.e. one of two dielectric layers).

A second aspect of the preferred embodiment of the present invention comprises a HTS tri-layer structure in which the HTS layers, i.e., both under- and over-layers, are fully oxygenated and a method for providing the same. As is described above, typically oxygenation of HTS under-layers has been problematic due to the over-layer and mid-layer of the tri-layer structure acting as barriers to oxygen diffusion into the HTS under-layer. However, it has been discovered that oxygenation of an HTS under-layer, e.g. YBCO, may be successfully accomplished by modifying the "cool down schedule" typically used for HTS single layer. Specifically, a tri-layer structure comprising a YBCO under-layer will achieve complete oxygenation by: (1) cooling the tri-layer from the growth temperature ($T_B$=815° C.) to $T_B$=550° C. at 20° C./min. with P(O$_2$)=760 Torr; (2) holding the tri-layer at $T_B$=550° C. for 60 hours; (3) then allowing to cool to room temperature. It has been found that achieving complete oxygenation is dependent on the time and temperature of the oxygen anneal step. For example, it was discovered that a time of 6 hours resulted in incomplete oxygenation, and that a temperature of 450° C. resulted in incomplete oxygenation.

Therefore, it has been discovered that where layers of a tri-layer structure are of high quality and where oxygen anneal time and temperature are carefully selected, then it is possible to oxygenate a YBCO under-layer, even in a tri-layer structure, using standard temperature technique (i.e. without requiring extra equipment and without requiring generation of an oxygen plasma). Although the present invention provides for re-oxygenation of an underlaying HTS layer through the use of an annealing step, it would not be detrimental to the tri-layer structure of the present invention to use other methods to accomplish oxygenation (e.g. plasma treatments) provided that the HTS under-layer is sufficiently oxygenated by the treatment.

A third aspect of the preferred embodiment of the present invention comprises a HTS tri-layer structure in which a thick dielectric mid-layer is used without cracking the HTS over-layer, and a method of preparing the same. This aspect is achieved by using materials with better matched thermal expansion coefficients. For example, in a preferred embodiment MgO is used as the substrate material and YBCO is used as the under-layer for the tri-layer structure. It is known that MgO has a thermal expansion coefficient that is closer to that of YBCO than LaAlO$_3$. However, it is also known that MgO has a poorer lattice mismatch to YBCO than does LaAlO$_3$. This problem is overcome by the use of a buffer layer between the under-layer and the substrate.

For example, for a YBCO under-layer and a MgO substrate, a buffer layer of SrTiO$_3$ compensates for the lattice mismatch problem, and improves the quality of the layers. See, e.g., J. Cheung, et al., "Reproducible Growth of High Quality YBa$_2$Cu$_3$O$_{7-x}$ Thin Films on (100) MgO With a SrTiO$_3$ Buffer Layer by Pulsed Laser Deposition," 60 Appl. Phys. Lett. 3180 (1992). It is preferred that, in this example, the MgO substrate be annealed at 1050° C. for 2.5 hours prior to growth, to improve the reproducibility and quality of the layers. See, e.g., B. H. Moeckly, et al., "Growth of YBa$_2$Cu$_3$O$_7$ Thin Films on MgO: The Effect of Substrate Preparation," 57 Appl. Phys. Lett. 1687 (1990).

Figure 2:
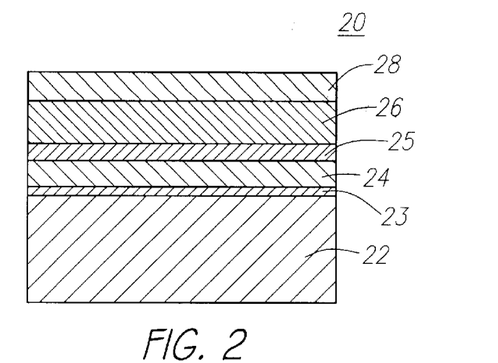
FIG. 2 is a diagram showing a preferred embodiment of a tri-layer structure of the present invention.

An exemplary schematic of the preferred embodiment of the present tri-layer invention 20 is shown in FIG. 2. As shown in FIG. 2, the preferred embodiment 20 comprises a substrate 22, a buffer layer 23 on the substrate 22, a HTS under-layer 24 on the buffer layer 23, a capping-layer 25 on the HTS under-layer 24, an insulator mid-layer 26 on the capping-layer 25, and a HTS over-layer 28 on the mid-layer 26. Each layer of the preferred embodiment preferably comprises the following: the substrate 22 is preferably (100)-MgO or LaAlO$_3$; with an MgO substrate the buffer layer 23 is preferably used and is preferably a SrTiO$_3$ layer about 15–30 nm thick and even more preferably about 0.02 μm thick; the HTS under-layer 24 is preferably a YBCO layer about 0.010–1 μm thick and even more preferably about 0.15–0.5 μm thick; the capping-layer 25 is preferably a SrTiO$_3$ layer which for MgO substrates is preferably about 100–200 nm thick and even more preferably about 120 nm thick, and for LaAlO$_3$ substrates is preferably about 40–200 nm thick; the insulator mid-layer 26 is preferably a NdAlO$_3$ layer which is preferably about 0.01–2.0 μm thick, even more preferably about 0.5–1.5 μm thick, and most preferably about 0.8 μm thick; and the HTS over-layer 28 is preferably a YBCO layer about 0.010–1 μm thick and even more preferably about 0.15–0.5 μm thick. Thus, the resulting preferred embodiment is a tri-layer having a thickness of about 0.07–6.0 μm (excluding substrate), even more preferably about 0.9–2.8 μm (excluding substrate), and most preferably about 1.9 μm (excluding substrate). As thicker layers are used, the anneal time must be adjusted.

When an embodiment of the tri-layer structure of the present invention was prepared on a (100)-LaAlO$_3$ substrate wherein the YBCO over- and under-layers were about 0.5 μm, the SrTiO$_3$ capping-layer was about 120 nm, and the NdAlO$_3$ mid-layer was about 0.8 μm, it was found that the YBCO over-layer had cracks as observed with an optical microscope. It was also found that YBCO over-layers cracked for a tri-layer structure on a (100)-LaAlO$_3$ substrate, even when the thicknesses of the layers was reduced to YBCO under- and over-layers about 0.3 μm, NdAlO$_3$ mid-layer about 0.2 μm, and SrTiO$_3$ capping-layer about 0.06 μm.

A preferred embodiment of the tri-layer structure of the present invention was prepared by growing the layers by Pulsed Laser Deposition (PLD). It is preferred that the laser ablation chamber be equipped with a multi-target holder to permit in-situ growth of multi-layers. However, other deposition techniques could be used, including sputtering, molecular beam epitaxy, and/or MOCVD.

As is described above and is shown in FIG. 2, a buffer layer 23 (e.g. SrTiO$_3$) was grown on a substrate 22 (e.g. (100)-MgO) to improve the quality of subsequently grown layers. A HTS under-layer 24 (e.g. YBCO) was grown over the buffer layer 23, and was capped with a capping-layer 25 (e.g. SrTiO$_3$) enabling high quality mid-layer 26 growth at low oxygen pressures. An insulator mid-layer 26 (e.g. NdAlO$_3$) was grown over the capping-layer 25 and an HTS over-layer 28 (e.g. YBCO) was grown over the mid-layer 26.

The growth conditions for each layer is given in Table II below where $T_B$ is the substrate temperature, $P(O_2)$ is the oxygen pressure, F is the laser pulse repetition frequency, and the laser spot energy density on the targets was 3.5 J/cm$^2$.

TABLE II

| Layer | d µm | $T_B$° C. | P ($O_2$) Torr | F Hz | 1 cm |
|---|---|---|---|---|---|
| SrTiO$_3$ buffer | 0.02 | 815 | 0.20 | 1 | 7 |
| YBCO under-layer | 0.50 | 815 | 0.70 | 3 | 7 |
| SrTiO$_3$ cap | 0.12 | 815 | 0.20 | 3 | 7 |
| NdAlO$_3$ mid-layer | 0.80 | 800 | 0.02 | 10 | 6 |
| YBCO over-layer | 0.50 | 815 | 0.70 | 3 | 7 |

After growth of the tri-layer structure, the oxygen pressure was increased to 760 Torr, the film was cooled at 20° C./minute to TB of 550° C. The film was kept at about 550° C. under 760 Torr oxygen for 60 hours, and then allowed to cool to room temperature. The resultant tri-layer structure was characterized with reflection high energy electron diffraction (RHEED) and atomic force microscopy (AFM).

Figure 3A:
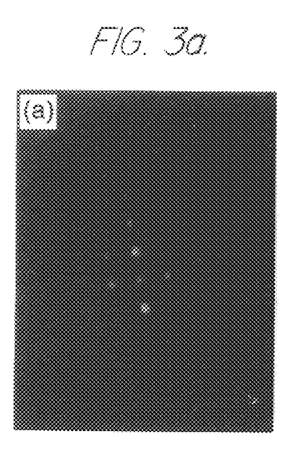
FIG. 3a is a RHEED pattern obtained from a $NdAlO_3$ surface grown at $T_B$=800° C. and $P(O_2)$=0.5 Torr on YBCO on a (100)-$LaAlO_3$ substrate wherein a $SrTiO_3$ capping-layer was used over the YBCO.

Reflection high energy electron diffraction (RHEED) was used to confirm the growth mode (two-dimensional or three-dimensional) of the insulator mid-layer 26. FIG. 3a shows the RHEED pattern obtained from a NdAlO$_3$ surface grown at $T_B$=800° C. and P(O$_2$)=0.5 Torr on YBCO on a (100)-LaAlO$_3$ substrate. The spotted electron diffraction pattern shown in FIG. 3a indicates that the growth was in a three-dimensional mode.

Figure 3B:
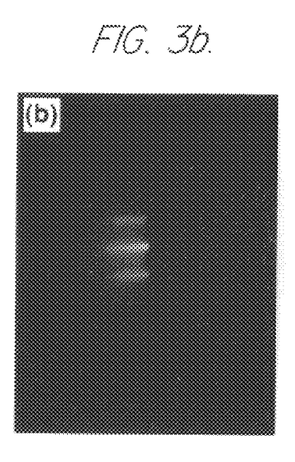
FIG. 3b is a RHEED pattern obtained from a $NdAlO_3$ surface grown at $T_B$=800° C. and $P(O_2)$=0.02 Torr on YBCO on a (100)-$LaAlO_3$ substrate wherein a $SrTiO_3$ capping-layer was used over the YBCO.

FIG. 3b shows the RHEED pattern obtained from a NdAlO$_3$ surface grown at $T_B$=800° C. and P(O$_2$)=0.02 Torr on YBCO on a (100)-LaAlO$_3$ substrate. A SrTiO$_3$ capping-layer was used to protect the YBCO in this example. The streaky RHEED pattern shown in FIG. 3b indicates that the growth was in a two-dimensional mode.

Figure 3C:
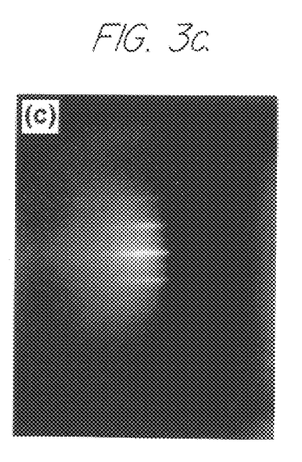
FIG. 3c is a RHEED pattern obtained from a YBCO surface of a tri-layer of the present invention which has a $SrTiO_3$ capping-layer thereon and which was grown on a (100)-$LaAlO_3$ substrate.

FIG. 3c shows the RHEED pattern obtained from a YBCO over-layer surface of a tri-layer grown on a (100)-LaAlO$_3$ substrate and using a SrTiO$_3$ capping-layer to protect the YBCO under-layer. The streaky RHEED pattern shown in FIG. 3c indicates that the YBCO over-layer growth was in a two-dimensional mode.

Figure 4A:
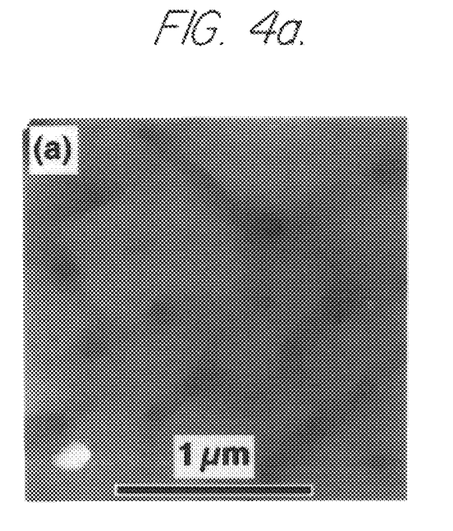
FIG. 4a is an AFM micrograph of a YBCO surface of a tri-layer of the present invention grown on a (100)-LaAlO$_3$ substrate.
Figure 4B:
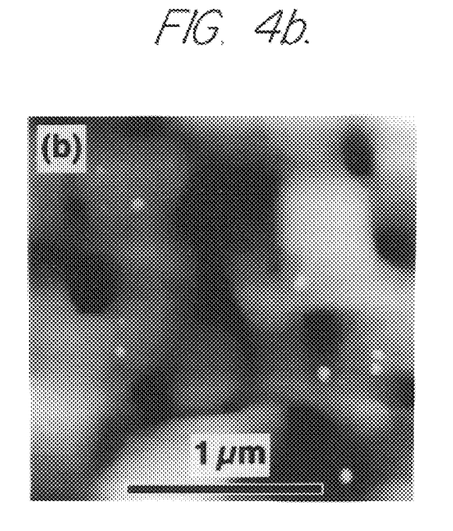
FIG. 4b is an AFM micrograph of a YBCO surface of a tri-layer of the present invention grown on a MgO substrate.

The surface morphology of the tri-layer structures was examined using Atomic Force Microscopy (AFM). FIGS. 4a and 4b show the YBCO over-layer surface of tri-layers grown on (100)-LaAlO$_3$ and (100)-MgO substrates respectively. The mean roughness of the YBCO over-layer in the tri-layer structure of the present invention was found to be about 4 nm (i.e. similar to that of a single layer YBCO film).

The transition temperature, $T_c$, and width of transition, $\Delta T_c$, of the YBCO layers in the tri-layer were measured by an inductive method and found to be: $T_c$=91K and $\Delta T_c$=0.7K for YBCO over-layer on (100)-MgO and on (100)-LaAlO$_3$, and $T_c$=91K and $\Delta T_c$=0.9K for YBCO under-layer on (100)-MgO and on (100)-LaAlO$_3$.

Figure 5:
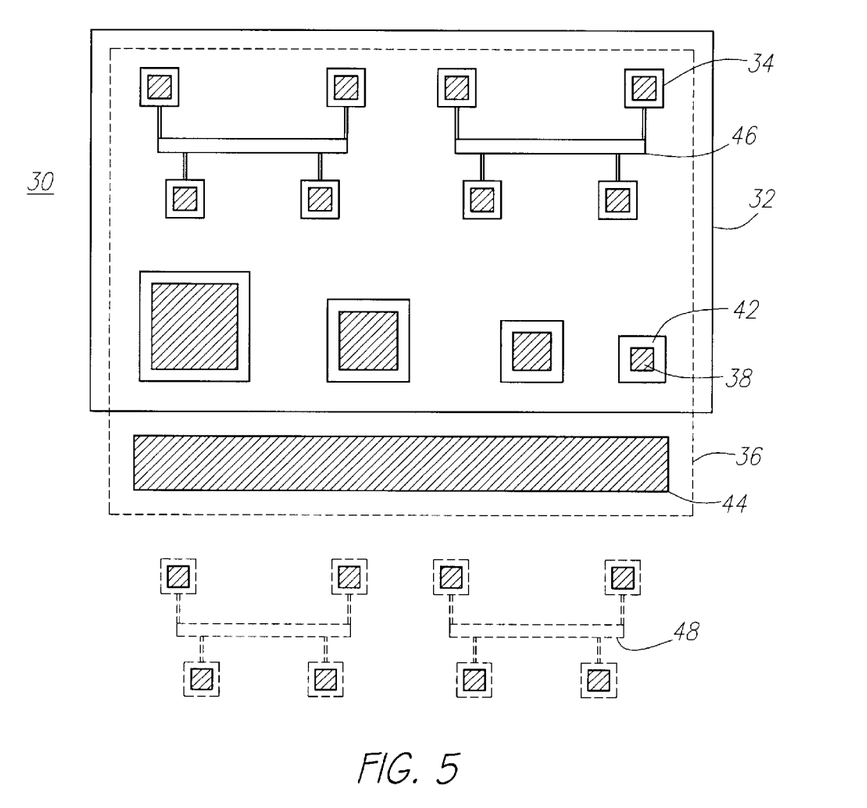
FIG. 5 is a schematic of a characterization mask for a tri-layer of the present invention.

A characterization mask suitable for 1 cm×1 cm substrates was used to pattern the tri-layer for measurements of over-layer and under-layer critical current density, $J_c$. A schematic of such a mask 30 is shown in FIG. 5 wherein the mask 30 comprises four layers having patterns for: (1) dielectric 32 etch; (2) YBCO over-layer 34; (3) YBCO under-layer 36; and (4) contact metal 38. The mask 30 also includes capacitor top electrodes 42 and bottom electrodes 44, and a $J_c$ bridge 46 in the over-layer and a $J_c$ bridge 48 in the under-layer.

Figure 6:
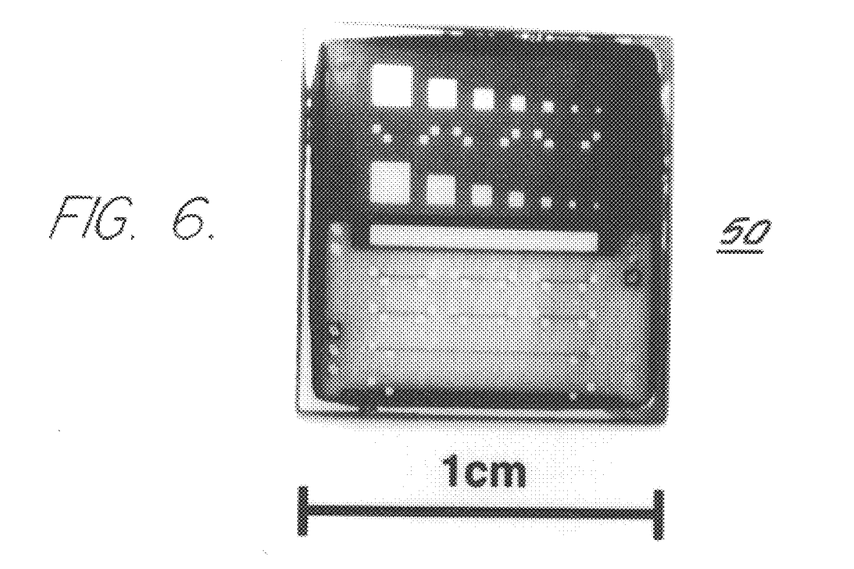
FIG. 6 is a photograph of a patterned and metallized tri-layer of the present invention.

Processing a tri-layer structure with this mask 30 involves standard photolithographic techniques and comprises the following steps: (1) using the dielectric etch mask 32 to etch the HTS over-layer and the dielectric over half the sample area by ion-milling to expose the HTS under-layer; (2) patterning the HTS over-layer; (3) patterning the HTS under-layer; and (4) depositing and patterning the contact metal (e.g. Au) by a wet chemical etch (e.g. Au-etch). A photograph of a patterned and metallized tri-layer structure 50 is shown in FIG. 6.

The patterned and metallized devices 50 include bridges about 20 µm wide and about 1000 µm long, with four-terminal contacts for separate $J_c$ measurements of the over-layer and the under-layer. The $J_c$ of the layers is measured using a 1 µV/cm criterion. The results on (100)-MgO were as follows: $J_c$ of about 1.5×10$^6$ A/cm$^2$ at 77K for a YBCO over-layer; and $J_c$ of about 1.0×10$^6$ A/cm$^2$ at 77K for a YBCO under-layer. The $J_c$ results of a tri-layer with a YBCO over-layer on (100)-LaAlO$_3$ could not be measured due to cracks in the YBCO over-layer.

In addition to $J_c$ bridges, parallel-plate capacitors were also fabricated. The parallel-plate capacitors were fabricated having different YBCO over-layer electrode 42 areas (1024× 1024 µm$^2$ to 128×128 µm$^2$) with a common YBCO under-layer electrode 44, as shown in FIG. 5. The NdAlO$_3$ mid-layer acts as the dielectric for the capacitor. At 77K, the measured capacitance for a pad area of 1024 µm×1024 µm was 232 pF, and that for 128 µm×128 µm was 3.4 pF. A plot of capacitance versus pad area is shown in FIG. 7.

Figure 7:
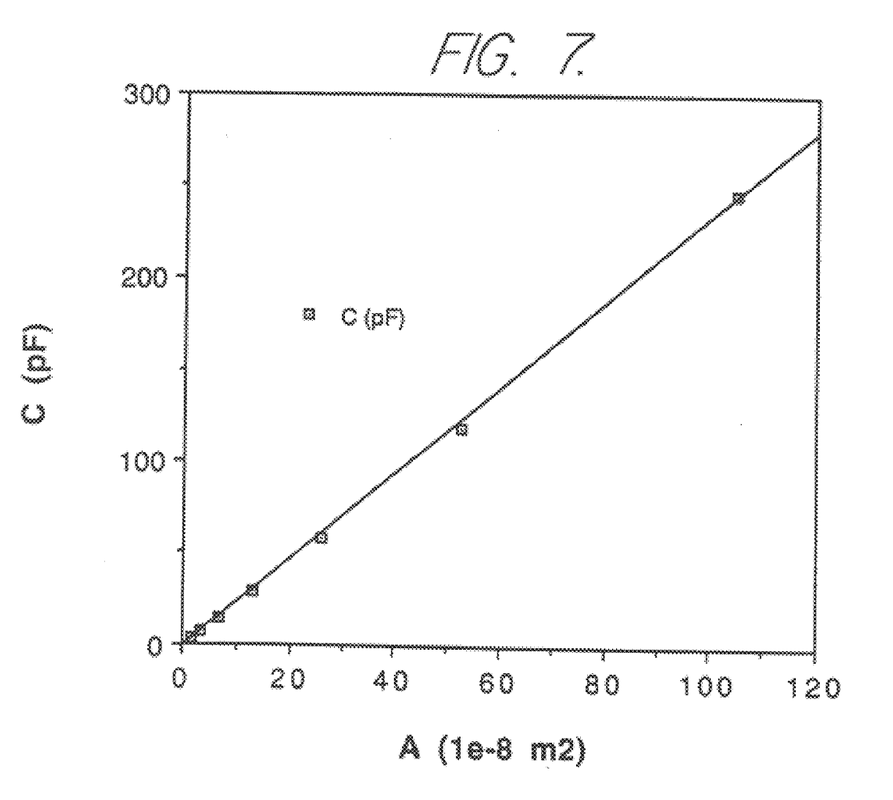
FIG. 7 is a graph showing capacitance versus pad area for a tri-layer capacitor of the present invention.

As is seen in the plot shown in FIG. 7, the capacitance scales linearly with pad area. From the slope of the plot and the known dielectric thickness, the dielectric constant of NdAlO$_3$ in the tri-layer was estimated to be 21 (which agrees well with the bulk value for NdAlO$_3$).

The resistivity of the dielectric was measured by measuring the resistance ($R_p$) in parallel with each capacitance ($C_p$). At 77K, the resistivity of the dielectric was found to be about 1×10$^7$ Ωcm. The high resistivity value shows that the dielectric layer is substantially pinhole free, as pinholes would lead to short circuits between the HTS layers and the low dielectric resistivity values.

While an embodiment of the present invention has been shown and described, various modifications may be made without departing from the scope of the present invention, and all such modifications and equivalents are intended to be covered. For example, other substrates and materials are possible for inclusion in the tri-layer. The parameters of capping-layer thickness and growth conditions, anneal time and temperature should be optimized in each case.

The tri-layer growth method of the present invention could be extended to other substrates such as SrTiO$_3$, NdAlO$_3$, or any other substrate reported in the literature for HTS growth. It could also include any slow diffuser of oxygen, such as MgO, LaLiTi$_2$O$_6$, and/or LaNaTi$_2$O$_6$, as the capping-layer. In addition, the intermediate mid-layer of the tri-layer need not be an insulator, and could include, e.g., CeO$_2$, LaGaO$_3$, LaAlO$_3$, NdGaO$_3$, and/or PrGaO$_3$. Furthermore, any HTS material could be used for the over- and/or under-layers (i.e. the over- and under-layers need not be of the same HTS material). The deposition method(s) used in preparation of the tri-layer may also include sputtering, molecular beam epitaxy, and/or MOCVD.

In general, the method of the present invention may be practiced and applied to any case in which: (1) the HTS material decomposes under conditions required for two-dimensional growth of the mid-layer; and/or (2) it is necessary to oxygenate the HTS under-layer of a tri-layer structure; and/or (3) the tri-layer structure cracks due to thermal expansion mismatch between the materials in the tri-layer and the substrate.

I claim:

1. A method for forming a layered superconducting article comprising the steps of:
   (1) forming a first superconductor layer on a substrate,
   (2) forming a layer of an oxide on the first superconductor layer,
   (3) forming a layer of a dielectric on the oxide layer,
   (4) forming a second superconductor layer on the dielectric layer, and
   (5) annealing the article in an oxygen atmosphere.

2. The method of claim 1 wherein the annealing step fully oxygenates the superconductor layers.

3. The method of claim 1 wherein the annealing step comprises the steps:
   (1) cooling the article from a growth temperature of greater than about 550° C. to about 550° C. under an atmosphere of oxygen at about 760 Torr;
   (2) holding the article at about 550° C. under about 760 Torr oxygen for about 60 hours; and
   (3) allowing the article to cool.

4. The method of claim 1 wherein the dielectric layer is grown without decomposing an underlying superconductor layer into various oxides, and wherein the grown dielectric layer exhibits a streaky RHEED pattern.

5. The method of claim 2 wherein the first superconductor layer has an oxygen diffusion constant of $D_O(X)$ and the oxide has an oxygen diffusion constant of $D_O(Y)$ and the ratio of $D_O(X)/D_O(Y)$ is between approximately 10 and $10^{25}$.

6. The method of claim 5 wherein the ratio of $D_O(X)/D_O(Y)$ is between approximately $10^3$ and $10^{20}$.

7. The method of claim 5 wherein the ratio of $D_O(X)/D_O(Y)$ is between approximately $10^4$ and $10^{18}$.

8. The method of claim 1 wherein the first and second superconductor layers are high temperature superconducting films.

9. The method of claim 1 wherein the oxide is at least one of MgO, $SrTiO_3$, $LaLiTi_2O_6$, and $LaNaTi_2O_6$.

10. The method of claim 1 wherein the first superconductor layer is approximately between about 0.01 and 1 $\mu$m thick.

11. The method of claim 10 wherein the first superconductor layer is approximately between about 0.15 and 0.5 $\mu$m thick.

12. The method of claim 1 wherein the oxide is approximately between about 40 and 200 nm thick.

13. The method of claim 12 wherein the oxide is approximately about 120 nm thick.

14. The method of claim 1 wherein the dielectric layer is approximately between about 0.01 and 2.0 $\mu$m thick.

15. The method of claim 14 wherein the dielectric layer is approximately between about 0.5 and 1.5 $\mu$m thick.

16. The method of claim 1 wherein the second superconductor layer is approximately between about 0.01 and 1 $\mu$m thick.

17. The method of claim 16 wherein the second superconductor layer is approximately between about 0.15 and 0.5 $\mu$m thick.

18. The method of claim 1 wherein the first superconductor layer is YBCO.

19. The method of claim 1 wherein the oxide layer is $SrTiO_3$.

20. The method of claim 1 wherein the dielectric layer is $NdAlO_3$.

21. The method of claim 1 wherein the second superconductor layer is YBCO.

* * * * *